United States Patent
Na

(10) Patent No.: US 8,222,934 B2
(45) Date of Patent: *Jul. 17, 2012

(54) DLL CIRCUIT AND METHOD OF CONTROLLING THE SAME

(75) Inventor: Kwang-Jin Na, Gyeonggi-do (KR)

(73) Assignee: SNK Patent Law Offices, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/038,604

(22) Filed: Mar. 2, 2011

(65) Prior Publication Data

US 2011/0148487 A1 Jun. 23, 2011

Related U.S. Application Data

(63) Continuation of application No. 11/819,631, filed on Jun. 28, 2007, now Pat. No. 7,911,246.

(30) Foreign Application Priority Data

Nov. 14, 2006 (KR) .................. 10-2006-0112262

(51) Int. Cl.
*H03L 7/06* (2006.01)
(52) U.S. Cl. ......................... 327/149; 327/158
(58) Field of Classification Search .............. 327/149, 327/158, 141, 145, 152, 153, 156
See application file for complete search history.

(56) References Cited

U.S. PATENT DOCUMENTS

| 6,813,197 | B2 | 11/2004 | Park |
| 6,989,700 | B2 | 1/2006 | Kim |
| 7,103,133 | B2 | 9/2006 | Jung |
| 7,154,311 | B2 | 12/2006 | Lim |
| 7,161,397 | B2 | 1/2007 | Lee et al. |
| 7,170,313 | B2 | 1/2007 | Shin |
| 7,327,175 | B2 | 2/2008 | Lee |
| 7,436,230 | B2 | 10/2008 | Kim |
| 7,605,622 | B2 | 10/2009 | Choi et al. |
| 2006/0267649 | A1 | 11/2006 | Park et al. |
| 2007/0216455 | A1 | 9/2007 | Abbasi |

FOREIGN PATENT DOCUMENTS

| JP | 1019990082982 | 11/1999 |
| JP | 2005251370 | 9/2005 |
| JP | 2006-025131 | 1/2006 |
| KR | 1019990042341 | 6/1999 |
| KR | 10-1999-0057228 | 7/1999 |
| KR | 1020040020990 | 3/2004 |
| KR | 2004-260092 | 9/2004 |
| KR | 1020060035836 | 4/2006 |

*Primary Examiner* — Lincoln Donovan
*Assistant Examiner* — Diana J Cheng
(74) *Attorney, Agent, or Firm* — Venable LLP; Jeffri A. Kaminski

(57) ABSTRACT

A DLL circuit includes a clock selection control unit configured to generate a clock selection signal on the basis of a phase difference between a reference clock and a feedback clock and, after the clock selection signal is generated, to generate an initialization signal. A delay control unit, when the initialization signal is enabled, transfers an initial voltage to be generated by dividing an external power supply voltage to a delay unit as a control voltage, and controls a delay operation of a delay reference clock to be selected on the basis of the clock selection signal.

15 Claims, 3 Drawing Sheets

DLL CIRCUIT AND METHOD OF CONTROLLING THE SAME

CROSS-REFERENCE TO RELATED PATENT APPLICATION

This application is a continuation of U.S. application Ser. No. 11/819,631 filed Jun. 28, 2007, which claims benefit of Korean Patent Application No. 10-2006-0112262, filed on Nov. 14, 2006, in the Korean Intellectual Property Office, the disclosure of both of which is incorporated herein in its entirety by reference.

BACKGROUND OF THE INVENTION

1. Technical Field

The present invention relates to a DLL (Delay Locked Loop) circuit and a method of controlling the same. More particularly, the present invention relates to an analog DLL circuit that controls a control voltage at an initial operation so as to prevent an erroneous operation from occurring, and to a method of controlling a DLL circuit.

2. Related Art

In general, a DLL circuit is used to generate an internal clock having a phase earlier than a phase of a reference clock that is obtained through conversion of an external clock. In a semiconductor integrated circuit having relatively high integration, such as a synchronous DRAM (SDRAM) or the like, the internal clock that is synchronous with data needs to be in phase with the external clock.

Specifically, the external clock is input to a clock input buffer through an input pin of the semiconductor integrated circuit. The clock input buffer outputs the internal clock. Thereafter, the internal clock controls a data output buffer for data output. At this time, due to the clock input buffer, the internal clock has a phase delayed more than a phase of the external clock. Further, the internal clock is further delayed by delay elements in the semiconductor integrated circuit and then transmitted to the data output buffer.

Accordingly, the output data may be output after a large amount of time has elapsed as compared with the external clock, that is, a data output time after the external clock is applied, which means an output data access time may be extended.

The DLL circuit is used in order to solve this problem. The DLL circuit sets the phase of the internal clock to be earlier by a predetermined time than the external clock. Accordingly, the output data is output without delay with respect to the external clock. That is, the DLL circuit receives the external clock and generates the internal clock having a phase earlier than the external clock.

The DLL circuit includes a clock input buffer that converts the amplitude of the external clock so as to generate the reference clock. The reference clock is used for comparison with the phase of a feedback clock in a phase comparator. Further, the reference clock is used as an input signal of a delay line that generates the internal clock under the control of a shift register.

An analog DLL circuit divides the phase of the reference clock so as to generate a plurality of divided clocks, selects one clock among the plurality of divided clocks according to the phase comparison result of the reference clock and the feedback clock, and inputs the selected clock to the delay line. Further, the analog DLL circuit compares the phase of the reference clock with the phase of the feedback clock, generates the control voltage according to the comparison result, and supplies the control voltage to the delay line. Then, the phase of a delay clock to be generated by the delay line is controlled according to the level of the control voltage. For example, if the level of the control voltage exceeds a reference level, the delay line performs an operation to delay the phase of the input clock. Meanwhile, if the level of the control voltage is less than the reference level, the delay line performs an operation to advance the phase of the input clock.

Hereinafter, the DLL circuit according to the related art will be described with reference to the accompanying drawings.

FIGS. 1A and 1B are timing diagrams illustrating the operation of the DLL circuit according to the related art.

In FIGS. 1A and 1B, the reference clock clk_ref and the feedback clock clk_fb in the related art are shown.

As shown in FIG. 1A, when the phase of the feedback clock clk_fb precedes the phase of the reference clock clk_ref, the phase of the feedback clock clk_fb needs to be delayed and then synchronized with the phase of the reference clock clk_ref. In this case, the delay amount of a delay line needs to be increased. Accordingly, an operation to increase the level of the control voltage needs to be performed.

As shown in FIG. 1B, when the phase of the reference clock clk_ref precedes the phase of the feedback clock clk_fb, the phase of the feedback clock clk_fb needs to be advanced and then synchronized with the phase of the reference clock clk_ref. In this case, the delay amount of the delay line needs to be reduced. Accordingly, an operation to lower the level of the control voltage needs to be performed.

During the initial operation of the DLL circuit according to the related art, the phase of the reference clock clk_ref and the phase of the feedback clock clk_fb may be the same as each other. In this case, the control voltage to be generated by the delay control unit has a level of the ground voltage. At this time, if a DLL power supply voltage falls, the feedback clock clk_fb is delayed to establish the phase relationship shown in FIG. 1B. As shown in FIG. 1B, when the phase of the feedback clock clk_fb needs to be advanced, the level of the control voltage needs to be lowered. However, since the potential of the control voltage is the same as that of the ground voltage, the corresponding operation is not performed. In this case, the DLL circuit does not operate normally. As such, during the initial operation of the DLL circuit according to the related art, an erroneous operation may occur due to the level of the control voltage and the phase of the clock.

SUMMARY OF THE INVENTION

Embodiments of the present invention provide a DLL circuit that performs a stable operation and a method of controlling the same.

An embodiment of the present invention provides a DLL circuit including: a clock selection control unit configured to generate a clock selection signal on the basis of a phase difference between a reference clock and a feedback clock and, if the clock selection signal is generated, to generate an initialization signal; and a delay control unit configured, when the initialization signal is enabled, to transfer an initial voltage to be generated by dividing an external power supply voltage to a delay unit as a control voltage and to control a delay operation of a delay reference clock to be selected on the basis of the clock selection signal.

Another embodiment of the present invention provides a DLL circuit including: a clock selection control unit configured to generate a clock selection signal and an initialization signal in response to a phase comparison signal; a clock select unit configured to output one divided clock corresponding to the clock selection signal among a plurality of divided clocks as a delay reference clock; an initial voltage generate unit configured to generate an initial voltage from an external power supply voltage according to whether or not the initialization signal is enabled; a delay control unit configured to generate a control voltage in response to a pull-up signal, a pull-down signal, and the initial voltage; and a delay unit configured to delay the delay reference clock according to the control of the control voltage.

Still another embodiment of the present invention provides a method of controlling a DLL circuit including: generating a clock selection signal and an initialization signal in response to a phase comparison signal; selecting one divided clock corresponding to the clock selection signal among a plurality of divided clocks and outputting the selected divided clock as a delay reference clock; generating an initial voltage from an external power supply voltage according to whether or not the initialization signal is enabled; generating a control voltage in response to a pull-up signal, a pull-down signal, and the initial voltage; and delaying the delay reference clock according to the control of the control voltage.

DESCRIPTION OF EXEMPLARY EMBODIMENT

Hereinafter, an exemplary embodiment of the present invention will be described in detail with reference to the accompanying drawings.

Figure 1A:
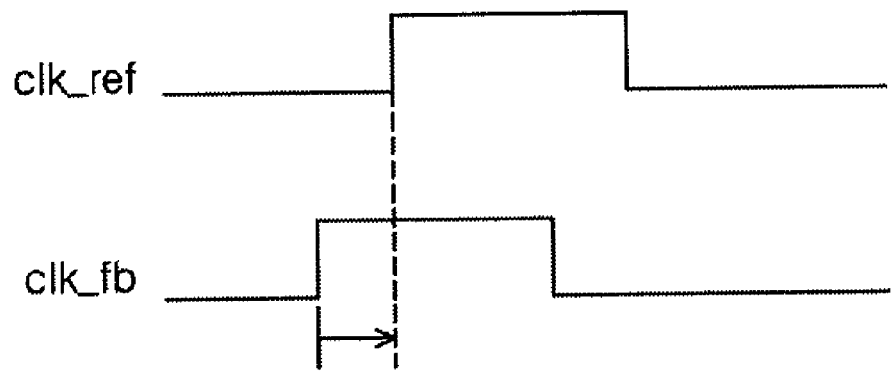
FIGS. 1A and 1B are timing diagrams illustrating the operation of a DLL circuit according to the related art.
Figure 1B:
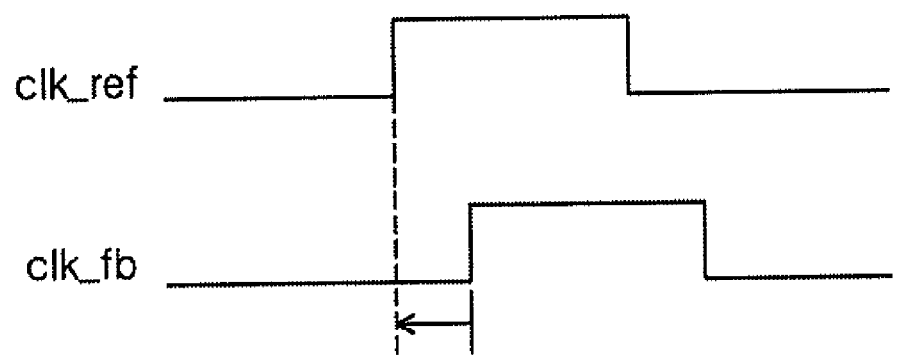
Figure 2:
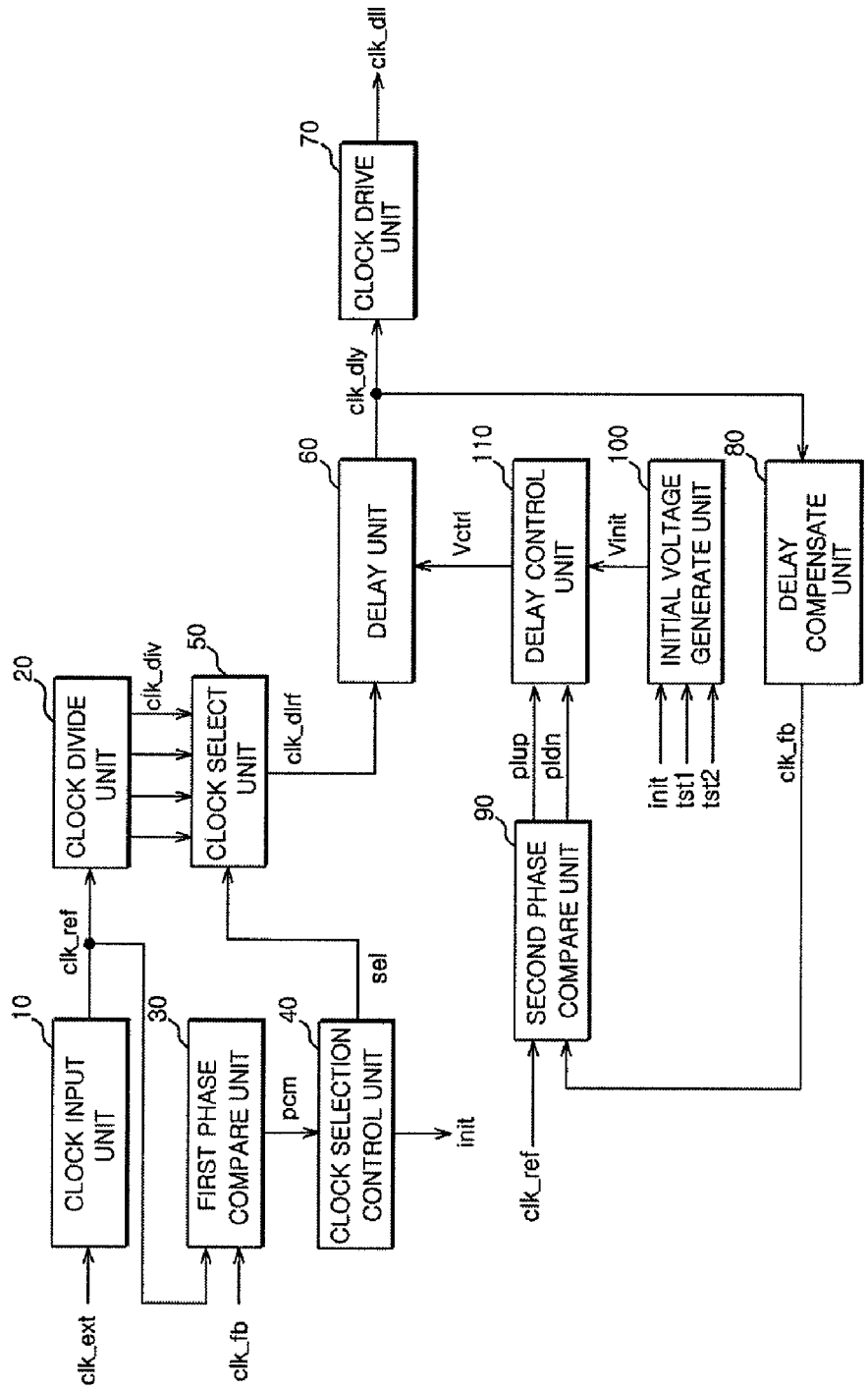
FIG. 2 is a block diagram illustrating a structure of a DLL circuit according to an embodiment of the present invention.

As shown in FIG. 2, a DLL circuit includes a clock input unit 10, a clock divide unit 20, a first phase compare unit 30, a clock selection control unit 40, a clock select unit 50, a delay unit 60, a clock drive unit 70, a delay compensate unit 80, a second phase compare unit 90, an initial voltage generate unit 100, and a delay control unit 110.

The clock input unit 10 receives an external clock clk_ext thereby outputting a reference clock clk_ref.

The clock divide unit 20 divides the phase of the reference clock clk_ref and outputs a plurality of divided clocks clk_div. For example, the clock divide unit 20 divides the reference clock clk_ref into eight equal sections and generates 8 divided clocks clk_div having a uniform rising edge interval.

The first phase compare unit 30 compares the phase of the reference clock elk_ref with the phase of the feedback clock clk_fb and generates a phase comparison signal pcm. The phase comparison signal pcm includes information about which of the two clocks has an earlier phase.

The clock selection control unit 40 generates a clock selection signal sel and an initialization signal init in response to the phase comparison signal pcm. The clock selection control unit 40 generates the clock selection signal sel for selecting one divided clock among the plurality of divided clocks clk_div according to information to be transferred by the phase comparison signal pcm.

The clock select unit 50 outputs one divided clock clk_div corresponding to the clock selection signal sel among the plurality of divided clocks clk_div as a delay reference clock clk_dlrf. After the clock select unit 50 selects one divided clock among the plurality of divided clocks clk_div, the clock selection control unit 40 enables the initialization signal init. Since the delay reference clock clk_dlrf is generated in such a manner, the delay operation of the reference clock clk_ref is simplified, and the operation efficiency of the DLL circuit is improved.

The delay unit 60 delays the delay reference clock clk_dlrf according to the control of a control voltage Vctrl thereby outputting a delay clock clk_dly.

The clock drive unit 70 drives the delay clock clk_dly thereby outputting a DLL clock clk_dll.

The delay compensate unit 80 delays the delay clock clk_dly and generates a feedback clock clk_fb so as to compensate a delay time by delay elements on a transmission path, through which the delay clock clk_dly is transmitted to a data output buffer.

The second phase compare unit 90 compares the phase of the reference clock clk_ref with the phase of the feedback clock clk_fb, thereby generating a pull-up signal plup and a pull-down signal pldn. That is, the pull-up signal plup and the pull-down signal pldn are enabled or disabled according to a phase relationship between the reference clock clk_ref and the feedback clock clk_fb. For example, if the phase of the feedback clock clk_fb precedes the phase of the reference clock clk_ref, the pull-up signal plup is enabled, whereas the pull-down signal pldn is disabled. Meanwhile, if the phase of the reference clock clk_ref precedes the phase of the feedback clock clk_fb, the pull-up signal plup is disabled, whereas the pull-down signal pldn is enabled.

The initial voltage generate unit 100 generates an initial voltage Vinit from an external power supply voltage VDD according to whether or not a first test signal tst1, a second test signal tst2, and the initialization signal init are enabled. The initial voltage generate unit 100 generates the initial voltage Vinit having a level higher than that of a ground voltage from the external power supply voltage VDD when the initialization signal init is enabled. The first test signal tst1 and the second test signal tst2 are signals that are used to find an appropriate level of the initial voltage Vinit during a designer's test. The first test signal tst1 and the second test signal tst2 may be fixed through a fuse circuit after the test.

The delay control unit 110 receives the pull-up signal plup, the pull-down signal pldn, and the initial voltage Vinit thereby generating the control voltage Vctrl. The delay control 110 drives the external power supply voltage VDD so as to generate the control voltage Vctrl when the pull-up signal plup is enabled, and drives the ground voltage VSS so as to generate the control voltage Vctrl when the pull-down signal pldn is enabled. During the initial operation of the DLL circuit, in a state where both the pull-up signal plup and the pull-down signal pldn are disabled, the delay control unit 110 outputs the initial voltage Vinit as the control voltage Vctrl. At this time, the initial voltage Vinit has a higher level than that of the ground voltage, as described above. Accordingly, even if the control voltage Vctrl is lowered in order to reduce the delay amount of a delay line of the DLL circuit, a normal operation can be performed.

Figure 3:
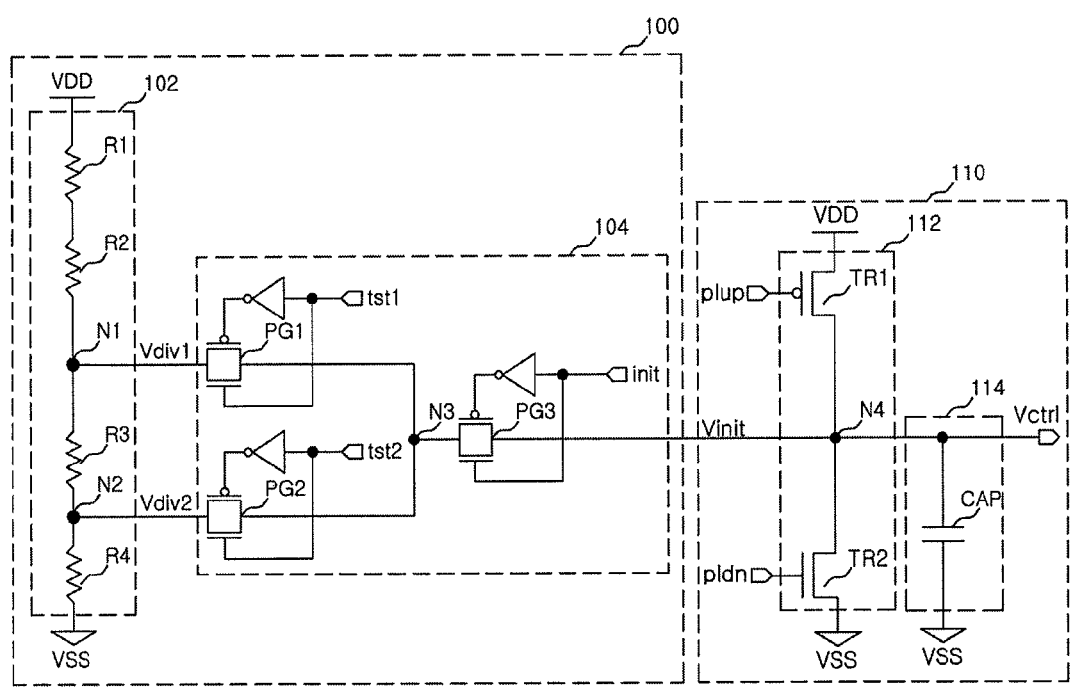
FIG. 3 is a diagram illustrating a detailed structure of an initial voltage generate unit and a delay control unit shown in FIG. 2.

FIG. 3 is a diagram illustrating a detailed structure of the initial voltage generate unit and the delay control unit shown in FIG. 2.

As shown in FIG. 3, the initial voltage generate unit 100 includes a voltage dividing section 102 and a switching section 104.

The voltage dividing section 102 divides the external power supply voltage VDD according to a resistance ratio thereby generating a first divided voltage Vdiv1 and a second divided voltage Vdiv2. The voltage dividing section 102 includes a plurality of resistors that are connected in series between a terminal of the external power supply voltage VDD and a ground terminal. Here, the plurality of resistors include, for example, four resistors R1 to R4. A first node N1 is provided between the second resistor R2 and the third resistor R3, and a second node N2 is provided between the third resistor R3 and the fourth resistor R4. The first divided voltage Vdiv1 is formed on the first node N1, and the second divided voltage Vdiv2 is formed on the second node N2.

The switching section 104 receives the first divided voltage Vdiv1 or the second divided voltage Vdiv2 and outputs the initial voltage Vinit in response to the first test signal tst1, the second test signal tst2, and the initialization signal init. The switching section 104 includes a first pass gate PG1 that, when the first test signal tst1 is enabled, transfers the first divided voltage Vdiv1 to a third node N3, a second pass gate PG2 that, when the second test signal tst2 is enabled, transfers the second divided voltage Vdiv2 to the third node N3, and a third pass gate PG3 that, when the initialization signal init is enabled, outputs a voltage applied to the third node N3 as the initial voltage Vinit.

On the other hand, the delay control unit 110 includes a driving section 112 that receives the initial voltage Vinit and drives the external power supply voltage VDD or the ground voltage VSS in response to the pull-up signal plup and the pull-down signal pldn, and a filtering section 114 that filters a voltage output from the driving section 112 thereby outputting the filtered voltage as the control voltage Vctrl.

The driving section 112 includes a first transistor TR1 having a gate terminal to which the pull-up signal plup is input, a source terminal to which the external power supply voltage VDD is applied, and a drain terminal coupled with a fourth node N4, and a second transistor TR2 having a gate terminal to which the pull-down signal pldn is input, a drain terminal coupled with the fourth node N4, and a source terminal grounded. The initial voltage Vinit is transmitted to the fourth node N4 from the initial voltage generate unit 100, thereby forming an output voltage.

The filtering section 114 includes a capacitor CAP that is provided between the fourth node N4 and a ground terminal.

As described above, the voltage dividing section 102 of the initial voltage generate unit 100 generates the first divided voltage Vdiv1 and the second divided voltage Vdiv2. At this time, it can be seen from the drawing that the level of the first divided voltage Vdiv1 is higher than the level of the second divided voltage Vdiv2. Thereafter, if the first test signal tst1 is enabled, the first pass gate PG1 of the switching section 104 is turned on, and thus the first divided voltage Vdiv1 is transferred to the third node N3. Meanwhile, if the second test signal tst2 is enabled, the second pass gate PG2 is turned on, and thus the second divided voltage Vdiv2 is transferred to the third node N3.

During the initial operation of the DLL circuit, if the initialization signal init is enabled, the third pass gate PG3 is turned on. Accordingly, the first divided voltage Vdiv1 or the second divided voltage Vdiv2 previously applied to the third node N3 is output as the initial voltage Vinit. A designer may select a voltage suitable for forming a level of the initial voltage Vinit from the first divided voltage Vdiv1 and the second divided voltage Vdiv2 and fix the enabled state of the first test signal tst1 or the second test signal tst2.

If the pull-up signal plup input to the driving section 112 of the delay control unit 110 is enabled, the first transistor TR1 is turned on, and thus the external power supply voltage VDD is supplied to the fourth node N4. Meanwhile, if the pull-down signal pldn is enabled, the second transistor TR2 is turned on, and thus the ground voltage VSS is supplied to the fourth node N4. Thereafter, the capacitor CAP of the filtering section 114 filters a voltage formed on the fourth node N4 and outputs the filtered voltage as the control voltage Vctrl.

During the initial operation of the DLL circuit, while the initialization signal init is enabled, both the pull-up signal plup and the pull-down signal pldn are disabled. At this time, the initial voltage Vinit is supplied to the fourth node N4, and the initial voltage Vinit is filtered and then output as the control voltage Vctrl.

That is, a delay control unit of the DLL circuit according to an embodiment of the present invention generates the initial voltage Vinit having a higher level than that of the ground voltage VSS during the initial operation of the DLL circuit, and uses the initial voltage Vinit as the control voltage Vctrl. Accordingly, even during the initial operation of the DLL circuit, the control voltage Vctrl has a higher level than that of the ground voltage VSS. Therefore, when the phase of the reference clock clk_ref input to the second phase compare unit 90 precedes the phase of the feedback clock clk_fb, the level of the control voltage Vctrl can be lowered, thereby normally performing the control operation of the delay amount of the delay line.

As described above, the delay control unit of the DLL circuit according to an embodiment of the present invention overcomes a technical limitation relative to an erroneous operation due to the level of the control voltage and the phase of the clock during the initial operation of the DLL circuit, thereby improving stability of the operation of the DLL circuit.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

The DLL circuit and the method of controlling the same according to an embodiment of the present invention generates the control voltage that forms a higher level than that of the ground voltage during the initial operation of the DLL circuit. Therefore, a stable phase delay locking operation can be performed regardless of the phase of the clock.

Further, according to the DLL circuit and the method of controlling the same, during the initial operation, an erroneous operation according to the conditions, such as the phase of the clock and the level of the control voltage, can be prevented from occurring.

What is claimed is:
1. A DLL (Delay Locked Loop) circuit comprising:
a clock input unit configured to receive an external clock thereby outputting a reference clock;
a clock divide unit configured to divide a phase of the reference clock to output a plurality of divided clocks;
a clock selection control unit configured to generate a clock selection signal on the basis of a phase difference between the reference clock and a feedback clock and to generate an initialization signal being different from the clock selection signal;
a clock select unit configured to generate a delay reference clock which is one divided clock corresponding to the clock selection signal from among the plurality of divided clocks, according to the clock selection signal; and a delay block configured to delay the delay reference clock in response to a control voltage which is obtained by an initial voltage generated from the initialization signal and to output a delay clock.

2. The DLL circuit of claim 1,
wherein the delay block includes,
a delay control unit configured to generate the control voltage,
a delay unit configured to generate the delay clock, and
an initial voltage generating unit configured to generate the initial voltage using an external power supply voltage according to the initialization signal,
wherein the initial voltage has a higher level than that of a ground voltage.

3. The DLL circuit of claim 2,
wherein the delay control unit further comprises:
a driving section configured to receive the initial voltage and drive an external power supply voltage or the ground voltage as a voltage output in response to a pull-up signal and a pull-down signal; and
a filtering section configured to filter the voltage output from the driving section to obtain a filtered voltage and output the filtered voltage as the control signal.

4. The DLL circuit of claim 3,
wherein the driving section comprises:
a first transistor having a gate terminal to which the pull-up signal is input, a source terminal to which the external power supply voltage is applied, and a drain terminal coupled with a first node; and
a second transistor having a gate terminal to which the pull-down signal is input, a drain terminal coupled with the first node, and a source terminal that is grounded, and
the initial voltage is transmitted to the first node so as to form the voltage output of the driving section.

5. The DLL circuit of claim 2,
wherein the initial voltage generating unit configured to generate the initial voltage from an external power supply voltage according to whether or not the initialization signal is enabled and transfer the initial voltage to the delay control unit.

6. The DLL circuit of claim 5,
wherein the initial voltage generate unit comprises:
a voltage dividing section configured to divide the external power supply voltage according to a resistance ratio so as to generate one or more divided voltages; and
a switching section configured to receive the one or more divided voltages and output the initial voltage according to whether or not the initialization signal is enabled.

7. The DLL circuit of claim 2,
wherein the clock select unit configured to receive the clock selection signal and output one divided clock among the plurality of divided clocks as the delay reference clock.

8. The DLL circuit of claim 2, further comprising:
a clock drive unit configured to drive the delay clock output from the delay unit thereby outputting a DLL clock;
a delay compensate unit configured to delay the delay clock and generate the feedback clock to compensate a delay time by delay elements on a transmission path, through which the delay clock is transmitted to a data output buffer; and a second phase compare unit configured to compare the phase of the reference clock with the phase of the feedback clock thereby outputting a pull-up signal and a pull-down signal.

9. The DLL circuit of claim 8,
wherein the second phase compare unit enables the pull-up signal when the phase of the feedback clock precedes the phase of the reference clock, enables the pull-down signal when the phase of the reference clock precedes the phase of the feedback clock, and disables both the pull-up signal and the pull-down signal while the initialization signal is enabled.

10. A DLL (Delay Locked Loop) circuit comprising:
a clock input unit configured to receive an external clock thereby outputting a reference clock;
a clock divide unit configured to divide a phase of the reference clock to output a plurality of divided clocks;
a first phase compare unit configured to compare the phase of the reference clock with a phase of the feedback clock thereby generating a phase comparison signal;
a clock selection control unit configured to generate a clock selection signal and an initialization signal in response to the phase comparison signal;
a clock select unit configured to output one divided clock corresponding to the clock selection signal from among the plurality of divided clocks as a delay reference clock;
an initial voltage generating unit configured to generate an initial voltage using an external power supply voltage according the initialization signal;
a delay control unit configured to generate a control voltage using the initial voltage; and
a delay unit configured to delay the delay reference clock according to the control voltage and output a delay clock.

11. The DLL circuit of claim 10,
wherein the initial voltage generating unit comprises:
a voltage dividing section configured to divide the external power supply voltage according to a resistance ratio so as to generate one or more divided voltages; and
a switching unit configured to receive the one or more divided voltages and output the initial voltage according to whether or not the initialization signal is enabled.

12. The DLL circuit of claim 10,
wherein the delay control unit comprises:
a driving section configured to receive the initial voltage and drive the external power supply voltage or the ground voltage as a voltage output in response to the pull-up signal and the pull-down signal; and
a filtering section configured to filter the voltage output from the driving section to obtain a filtered voltage and output the filtered voltage as the control voltage.

13. The DLL circuit of claim 10,
wherein the initial voltage has a higher level than that of a ground voltage.

14. The DLL circuit of claim 13, further comprising:
a clock drive unit configured to drive the delay clock output from the delay unit thereby outputting the delay clock as a DLL clock;
a delay compensate unit configured to delay the delay clock and generate the feedback clock so as to compensate a delay time by delay elements on a transmission path, through which the delay clock is transmitted to a data output buffer; and
a second phase compare unit configured to compare the phase of the reference clock with the phase of the feedback clock thereby outputting a pull-up signal and a pull-down signal.

15. The DLL circuit of claim 14,
wherein the second phase compare unit enables the pull-up signal when the phase of the feedback clock precedes the phase of the reference clock, enables the pull-down signal when the phase of the reference clock precedes the phase of the feedback clock, and disables both the pull-up signal and the pull-down signal while the initialization signal is enabled.

* * * * *

UNITED STATES PATENT AND TRADEMARK OFFICE
CERTIFICATE OF CORRECTION

PATENT NO. : 8,222,934 B2
APPLICATION NO. : 13/038604
DATED : July 17, 2012
INVENTOR(S) : Kwang-Jin Na It is certified that error appears in the above-identified patent and that said Letters Patent is hereby corrected as shown below:

Title page, Item (73) Assignee:

Please correct the name of the Assignee on the face of the patent from:

"SNK Patent Law Offices"

to

--Hynix Semiconductor Inc.--

Signed and Sealed this

Eleventh Day of September, 2012

David J. Kappos
*Director of the United States Patent and Trademark Office*